United States Patent [19]
Rapp et al.

[11] Patent Number: 5,202,686
[45] Date of Patent: Apr. 13, 1993

[54] INFRARED FOURIER TRANSFORMATION SPECTOMETER WITH PLURAL ANALOG-TO-DIGITAL CONVERTERS AND INTERLEAVED AMPLIFICATION FACTORS

[75] Inventors: Norbert Rapp, Malsch, Fed. Rep. of Germany; Jean-Francois Blavier, Fleron, Belgium; Arno Simon, Karlsruhe, Fed. Rep. of Germany

[73] Assignee: Bruker Analytisch Meβtechnik GmbH, Fed. Rep. of Germany

[21] Appl. No.: 602,172

[22] Filed: Oct. 23, 1990

[30] Foreign Application Priority Data

Oct. 26, 1989 [DE] Fed. Rep. of Germany ....... 3935617

[51] Int. Cl.$^5$ .............................................. H03M 1/18
[52] U.S. Cl. ..................................... 341/139; 341/138; 341/141
[58] Field of Search ............... 341/138, 139, 140, 141, 341/155

[56] References Cited

U.S. PATENT DOCUMENTS

| | | | |
|---|---|---|---|
| 4,069,479 | 1/1978 | Carpenter et al. | 341/139 |
| 4,129,864 | 12/1978 | Carpenter et al. | 341/139 |
| 4,449,120 | 5/1984 | Rialan et al. | 341/141 |
| 4,823,129 | 4/1989 | Nelson | 341/139 |
| 4,926,175 | 5/1990 | Ishizawa et al. | 341/131 |
| 4,999,628 | 3/1991 | Kakubo et al. | 341/139 |

FOREIGN PATENT DOCUMENTS

| | | |
|---|---|---|
| 0104333 | 7/1983 | European Pat. Off. |
| 2331890 | 6/1973 | Fed. Rep. of Germany |
| 3900247 | 1/1989 | Fed. Rep. of Germany |
| 274671 | 12/1989 | Fed. Rep. of Germany |
| WO8706080 | 10/1987 | PCT Int'l Appl. |
| 1545653 | 5/1979 | United Kingdom |

Primary Examiner—Howard L. Williams
Attorney, Agent, or Firm—Walter A. Hackler

[57] ABSTRACT

An infrared Fourier transformation spectrometer comprising a non-linear analog-to-digital converter device having at least one amplifier and one sample and hold circuit connected downstream thereof, as well as an an analog-to-digital converter following the latter, wherein an input signal to be converted is to be supplied to one input of the amplifier and the gain of the input signal is a function of the magnitude fo the input signal, and wherein the output signal of the analog-to-digital converter is evaluated giving regard to the respective gain, is characterized by the fact that at least two analog-to-digital converters are provided whose outputs are connected to a first controllable switching arrangement for supplying selectively the output signals of one of the said analog-to-digital converters to another evaulation means and that the input signal is supplied to each of the said analog-to-digital converters amplified by a different amplification factor. This allows to achieve high resolution by simple means.

9 Claims, 3 Drawing Sheets

INFRARED FOURIER TRANSFORMATION SPECTOMETER WITH PLURAL ANALOG-TO-DIGITAL CONVERTERS AND INTERLEAVED AMPLIFICATION FACTORS

BACKGROUND OF THE INVENTION

The present invention relates to an infrared Fourier transformation spectrometer comprising a non-linear analog-to-digital converter device having at least one amplifier and one sample and hold circuit connected downstream thereof, as well as an analog-to-digital converter following the latter, wherein an input signal to be converted is to be supplied to one input of the amplifier and the gain is a function of the magnitude of the input signal, and wherein the output signal of the analog-to-digital converter is evaluated giving regard to the respective gain.

Among the known infrared Fourier transformation spectrometers, there is for example one offered by Bruker Analytische Meßtechnik GmbH, D-7512 Rheinstetten, Federal Republic of Germany, as model IFS 88. An infrared interferometer incorporated in the spectrometer supplies the described input signal, namely an interferogram. The digital values supplied by the converter device are processed by Fourier transformation by an arithmetic unit, which is part of the spectrometer, in order to determine the frequency fractions of the interferogram.

Converter devices of the before-mentioned type have been known in the form of so-called floating-point analog-to-digital converters. In this case, the input signal is amplified by a variable-factor amplifier in such a way as to drive a subsequent fixed-point analog-to-digital converter module to the maximum. One achieves in this way higher resolution, by the amplification factor, and consequently a corresponding improvement of the volume range. The input signal is sampled in a sample and hold circuit. Thereafter, the optimum amplification factor is determined with the aid of comparators, and the amplifier is adjusted correspondingly. Thereafter, once the amplifier has assumed its steady-state condition, conversion can proceed. Given the fact that the sample and hold circuit has only limited resolution and holding capacity (pedestal error, drop rate), errors will arise which are then amplified as well. Consequently, high quality is needed for this sampling element. In addition, there may be cases where a different gain is adjusted for each sampling operation, so that the amplifier must assume its steady state very rapidly. The amplifier, therefore, must have a very important band width, and the amplification factors must be adjusted very precisely. Any balancing error will result in deteriorated resolution. And the other demands placed on the amplifier make it even more difficult to achieve high resolution.

DE-23 31 890 B2 shows a Fourier spectrometer comprising a single sample and hold circuit and a single analog-to-digital converter. A first signal path supplies signals characteristic of the position of the mirror, which are supplied to a sample and hold circuit as control signals. The signal to be sampled and to be converted is supplied via a different signal path.

EP-0 104 333 A2 describes an infrared Fourier transformation spectrometer which is capable of converting two different analog signals to digital values and of storing them practically simultaneously. This is achieved by operating analog-to-digital converters alternately.

From DE-39 00 247 A1 it results that it has been known before in connection with a Fourier spectrometer to have an analog-to-digital conversion preceded by an amplification step.

SUMMARY OF THE INVENTION

Now, it is the object of the present invention to provide a spectrometer of the type described above by means of which high resolution of the analog-to-digital conversion of the interferogram can be achieved by simple means. The invention achieves this object by the fact that at least two analog-to-digital converters are provided whose outputs are connected to a first controllable switching arrangement for supplying selectively the output signals of one of the analog-to-digital converters to another evaluation means, that the input signal is supplied to each of the analog-to-digital converters amplified by a constant but different amplification factor, that a plurality of amplifiers of different but constant amplification factors are arranged upstream of at least one of the analog-to-digital converters, that a second controllable switching arrangement is provided for selecting one of the signals, which have been amplified by the said plurality of amplifiers, for transmission to the analog-to-digital converter, and that in the event the second switching arrangement switches over, the first switching arrangement will switch over with a certain time delay, if at all.

It may happen that a very strong input signal can be processed without any amplification and that only certain weaker signal fractions need to be amplified. In any such case, it may still be convenient for technical reasons to guide the strong signal through an amplifier having the amplification factor 1, and for the sake of simplicity this is exactly what will be assumed hereafter.

One advantage of the invention is seen in the fact that the amplification factor of the individual amplifiers need not be changed, but that instead the amplifiers are permanently set to different amplification factors. This avoids possible delays in the evaluation process caused by the time required by an amplifier for assuming its steady-state condition after a change of its amplification factor. Uniform phase characteristics can be achieved for all amplifiers in a simple manner by the use of identical amplifiers in which case the desired amplification factor is achieved by the provision of subsequent different voltage dividers. Temperature stability of the amplifiers can be achieved in a simple manner. As the amplification factor need not be changed, any error resulting from incorrect adjustments of the amplification factor can be avoided. Finally, the invention makes it possible to create relatively simple converter devices using commercially available analog-to-digital converters with, for example, 14 or 16 bits, in which case the amplification leads to a conversion range of, for example, 20 bits at a sampling frequency of, for example, 20 Khz.

The evaluation of the output signals of the analog-to-digital converters must give due consideration to the amplification factors by which the signal supplied to the converter has been amplified.

Selection of the output signals of one particular of the analog-to-digital converters can be effected very rapidly with the aid of a digital switch, without giving rise to transient conditions which would then make it necessary to wait until the device has assumed its steady state. In order to minimize errors provoked by the analog-todigital converters or by the fact that the converter has an accuracy tolerance of +/−0.5 bit, the output signal selected for further processing should advantageously be the output signal of that converter which is driven to the maximum, i.e. which is supplied with a maximum analog input signal, without however being overloaded. In order to achieve this situation, i.e. that the converters are driven to the maximum, the different amplification factors used for the input signal should conveniently differ by a factor far smaller than $2^n$ wherein n is the number of bits of the analog-to-digital converter. Another advantage is seen in the fact that the number or analog-to-digital converters can be kept smaller than the total number of possible different amplification factors (including the amplification factor 1, if used).

The signal connected by the second controllable switching device is an analog signal. As in the event the second switching device switches over the first switching device will switch over only after a certain time delay, if at all, time is allowed for the circuitry connected downstream of the second switching device (for example the sample and hold circuit) to assume its steady state so that no errors will be caused by transient conditions.

According to one embodiment of the invention, at least one of the analog-to-digital converters is coupled to the output of one of the amplifiers, without a second switching device connected between these two elements. The arrangement is such that at least one other analog-to-digital converter can be coupled to one of several amplifiers by means of the before-mentioned second switching device. This leads to a particularly favorable arrangement, as will appear from the following description of another embodiment of the invention. In the case of this other embodiment of the invention, the device comprises a group consisting of two analog-to-digital converters and three amplifiers, one of the two analog-to-digital converters of the group is coupled, without an intermediate second switching device, to the output of that amplifier whose amplification factor is between the amplification factors of the two other amplifiers, and the other analog-to-digital converter can be coupled selectively to one of the outputs of the two other amplifiers, via a second controllable switching device. Consequently, the effective amplification factor is not changed over for one of the analog-to-digital converters and by switching the effective amplification factor of the other analog-to-digital converter between two values, in the described simple manner, it is possible to cover an input signal range the conversion of which requires the use of all the three amplification factors. In addition, it is an advantage of this arrangement that there are always simultaneously available the digital output signals of two neighboring analog-to-digital converters, speaking in terms of the conversion range, so that the selection as a function of the magnitude of the input signal can be effected very rapidly and in a trouble-free manner. There may also be provided more than one such groups in a device according to the invention.

According to one embodiment of the invention, there are provided two analog-to-digital converters, and each of the analog-to-digital converters is preceded by a plurality of amplifiers having different constant amplification factors. Consequently, this embodiment uses more than three amplifiers. The advantages achieved in this case are the same as those provided by the embodiment described immediately before.

The input signal supplied by the infrared interferometer, which comprises a moving mirror, develop constantly over time, i.e. do not change suddenly. The development over time of the described signal, as it results from the mirror movement, is generally known. Consequently, there may be provided, according to one embodiment of the invention, a sequence control for controlling the first and, if necessary, also the second switching device in response to the value of the input signal and the time, at least over part of the measurement and according to a fixed rule. It is thus possible, in particular, to follow a very rapid rise of the input signal.

According to one embodiment of the invention, a control device controls the first switching means and the second switching means in such a way that at any given time the output signals of at least two neighboring analog-to-digital converters are provided—neighboring as regards the working ranges—and are available for optional selection by the first switching means. This permits rapid switching over to the output signals of that analog-to-digital converter which is at that time driven to the maximum.

The sequence control is, preferably, designed in such a way that, based on general knowledge of the future signal curve, it will always switch on that analog-to-digital converter which corresponds to the signal present at any time and, in addition, that analog-to-digital converter (together with the corresponding amplification factor for the input signal, if this has to be selected) which will be needed the next in time.

DESCRIPTION OF THE PREFERRED EMBODIMENTS

Figure 1:
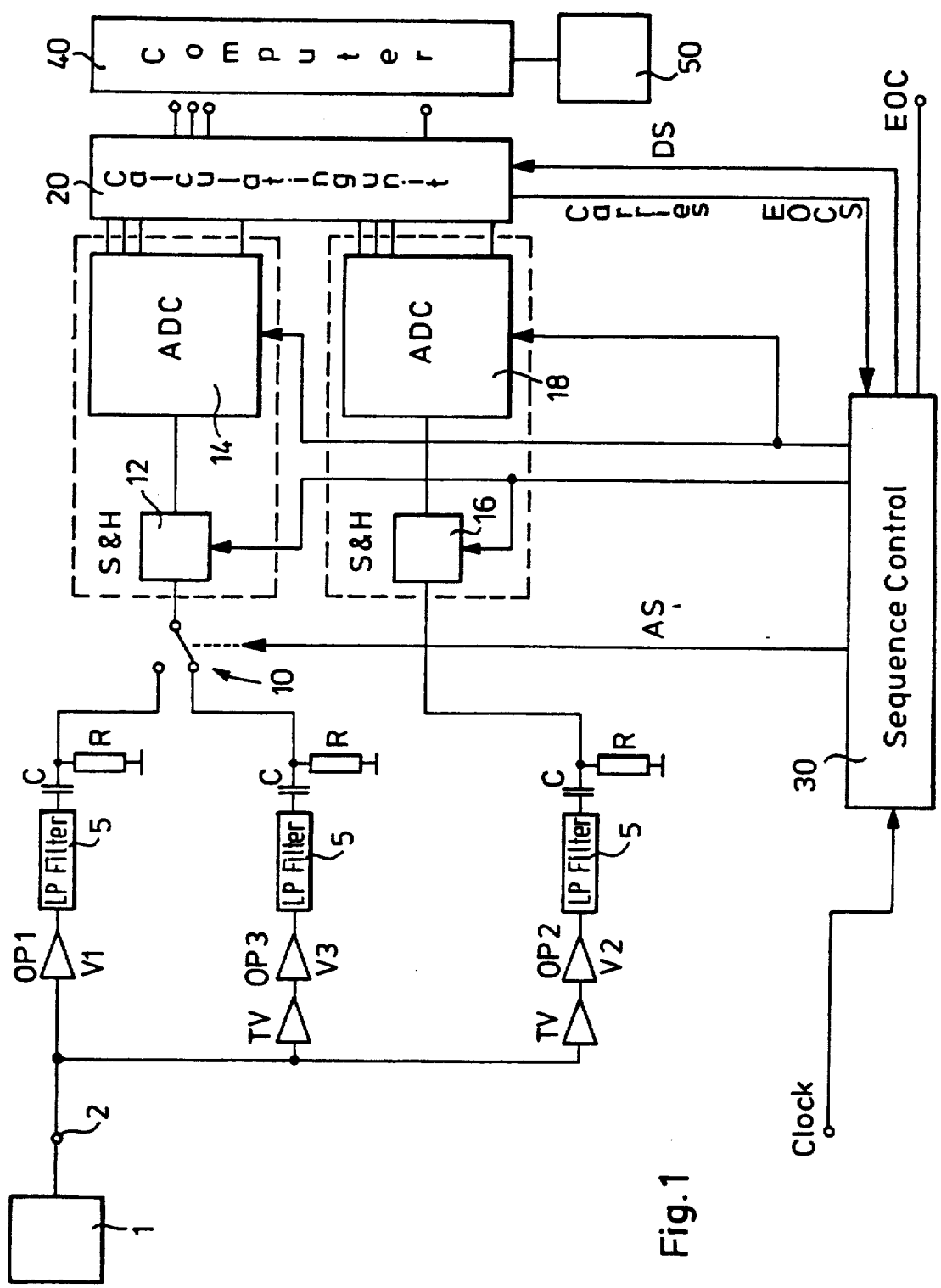
FIG. 1 shows a block diagram of one embodiment of an infrared Fourier transformation spectrometer comprising an analog-to-digital converter device.

In FIG. 1, an infrared interferometer 1, which comprises a detector, generates the signal to be converted at an input terminal 2 to which are connected the input of a first operational amplifier OP1 and, via buffer amplifiers TV, the inputs of two other operational amplifiers OP2 and OP3. The operational amplifiers OP1 to OP3 have different amplification factors, the amplification factor V1 of the first operational amplifier OP1 being the smallest, the amplification factor V3 of the third operational amplifier OP3 being the greatest, and the amplification factor V2 of the second operational amplifier OP2 being in between. The buffer amplifiers have an amplification factor of 1.

Each amplifier is followed by a low-pass filter 5 whose output signal is freed from any DC fractions by an RC element. The outputs of the RC elements assigned to the first and to the third operational amplifiers are connected in this diagram to a controllable change-over switch 10 in such a way that one of the two signals can be supplied selectively to the input of a sample and hold circuit (S and H) 12 whose output is then connected to the input of a first analog-to-digital converter 14. The output of the RC element assigned to the second operational amplifier OP2 is directly connected to the input of another sample and hold circuit 16 whose output is connected to an additional analog-to-digital converter 18. The before-mentioned sample and hold circuits and the analog-to-digital converters, respectively, have all the same design. The outputs of the two analog-to-digital converters 14 and 18 are connected to a calculating unit 20.

In order to avoid different phase-frequency characteristics, the operational amplifiers OP1 to OP3 make all use of absolutely identical amplifiers, the different amplification factors being obtained by different voltage dividers arranged at the outputs of the individual amplifiers.

While the RC elements remove all DC fractions, they let through the signals received from the output of the low-pass filters. The low-pass filters have the effect to reduce the band width of the signals to be processed and, consequently, the noise level.

A control device designated as sequence control 30 is supplied with a clock pulse. Control outputs of the sequence control control the switch 10, the sample and hold circuits 12 and 16 as well as the analog-to-digital converters 14 and 18. The calculating unit 20 sends different signals to the sequence control. An EOC (end of conversion) signal informs the sequence control that the signal supplied by the outputs of the analog-to-digital converters has been recognized and evaluated so that the sequence control 30 can, among other things, cause the sample and hold circuits 12 and 16 to sample another value of their respective input signals. In addition, the calculating unit 20 informs the sequence control 30 when an overflow has occurred for any of the analog-to-digital converters, i.e. when the maximum conversion range of the respective converter has been exceeded because its input signal has become excessively high. The sequence control then switches over to the other analog-to-digital converter which is not yet driven to the full. In particular, the arrangement is such that when the signal amplitude rises the amplification is reduced exactly at the moment when an overflow of the previously active analog-to-digital converter has occurred.

Data losses are prevented by the fact that there are always operating simultaneously the analog-to-digital converter with the previously optimum amplification factor, which has been driven to the optimum up to that moment, and another analog-to-digital converter with the next lower amplification factor (for a higher input signal) which is assumed to be required the next.

The sequence control 30 further sends signals to the calculating unit 20 which inform the latter which of the amplifiers is connected at any time to the sample and hold circuit 12. In addition, the sequence control supplies a switching signal to one of the digital switches contained in the calculating unit 20, which switch will then, depending on its switching position, connect the output signal of one exactly of the analog-to-digital converters 14 and 18 to an output of the arithmetic unit from where the signals will be transmitted to a computer 40 which will perform a Fourier transformation and supply the result to an output unit 50, such as a display or a printer.

Figure 2:
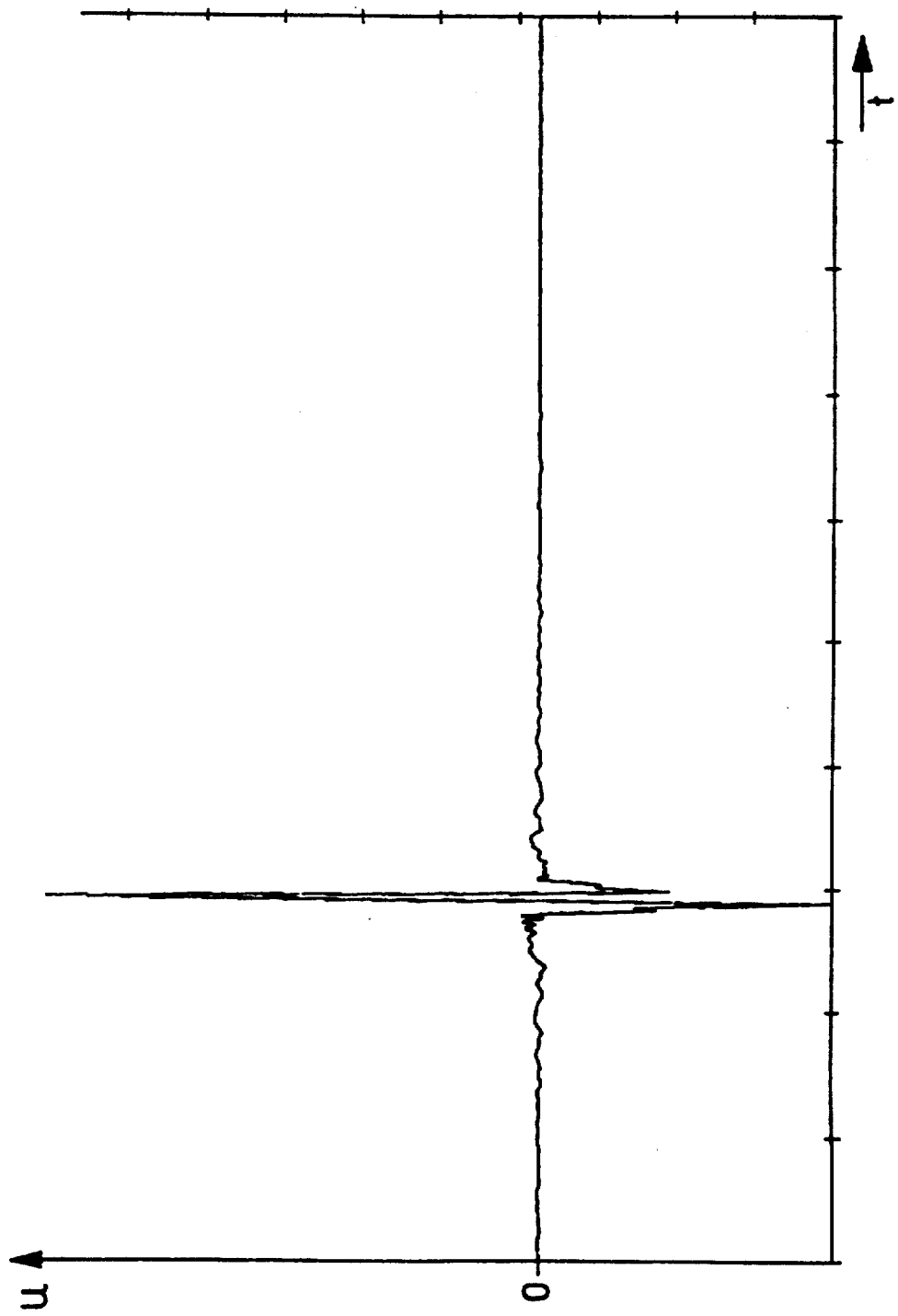
FIG. 2 shows a sample curve of an input signal for the converter device.

FIG. 2 shows an exemplary curve of a signal from the infrared interferometer 1 which is to be converted by the converter device contained in FIG. 1 (interferogram). The horizontal axis of FIG. 2 is the time axis, while the signal amplitude in volts has been plotted against the vertical axis. It can be seen that at the beginning the signal varies slightly at an amplitude of less than 0.4 V, rises then very quickly to a value of about 10 V, and drops thereafter again to very small values. The waveshapes before and after the occurrence of the maximum signal amplitude being very important for the Fourier transformation, it is necessary that these curve portions be converted to digital values with high precision. Given the fact that the general signal curve is known, the sequence control of the illustrated example is designed in such a way that initially the greatest amplification factor is active (the third operational amplifier OP3 is switched on and the analog-to-digital converter 14 is active), and as the magnitude of the signal supplied to the analog-to-digital converter 14 rises, the system is switched over to the analog-to-digital converter 18, which is coupled to the operational amplifier OP2 immediately when the first-mentioned analog-to-digital converter approaches its full-output limit. Thereafter, the switch 10 is switched over by the sequence control as the signal continues to rise. As soon as the analog-to-digital converter 18 approaches its upper full-output limit, the analog-to-digital converter 14 is switched on again, or the latter's output signals are selected so that the smallest amplification factor becomes active for the signal.

When the signal magnitude drops, the system described by way of example waits first to see if the signal will rise again within a short period of time. Otherwise the system will switch over to the analog-to-digital converter coupled to the amplifier having the next higher amplification factor at the moment when the signal is in a magnitude range which approaches the lower output limit of that analog-to-digital converter whose output signal is just being evaluated, being already in the upper range of the analog-to-digital converter coupled to the amplifier having the next higher amplification factor (due to the fact that the conversion ranges of the converters overlap each other).

During conversion of the analog signal illustrated in FIG. 2—viewed from the left to the right—switching-over is effected (digitally) by the first switching control from V2 to V1 (i.e. from the analog-to-digital converter 18 to the analog-to-digital converter 14) in order to accommodate the signal peak. Thereafter (as the signal magnitude drops), the system is switched-over again, digitally, to the converter coupled to the amplifier OP2. If the signal amplitude continues to drop, the analog switch (second switching means 10) switches over so that the analog-to-digital converter 14 is coupled to the amplifier OP3. Only when the signal remains within the full-output range of the analog-to-digital converter 14 will the system be switched over digitally to this latter converter with a certain time delay permitting the system to assume a steady state.

By proceeding in this way, it is ensured that the signal being evaluated at any time is always switched digitally and that sudden signal changes caused by transient conditions will be avoided in that analog branch which is active at any time. The demands placed on the rapidity by which analog switching must be effected are, therefore, not critical and transient conditions can be allowed to steady down. It is an advantage of the described arrangement that the by far greatest part of the interferogram is recorded by a single sample and hold circuit and a single analog-to-digital converter.

The sequence control may be effected in a purely digital way as monitoring the thresholds can be performed by means of the analog-to-digital converter active at any time. Time monitoring is effected by the clock pulse.

In the illustrated embodiment, the amplification factors are V1=1, V2=32, V3=128. This corresponds to the binary exponents of 1, 5 and 7. The analog-to-digital converters used in the example are model AD 1376 converters made by Analog Devices. The converters are of the 16 bit type and accept input voltages of plus/-minus 10 V. The converter characteristic of the device according to FIG. 1 is linear by sections.

The sample and hold circuit may be integrated in the respective analog-to-digital converter.

Figure 3:
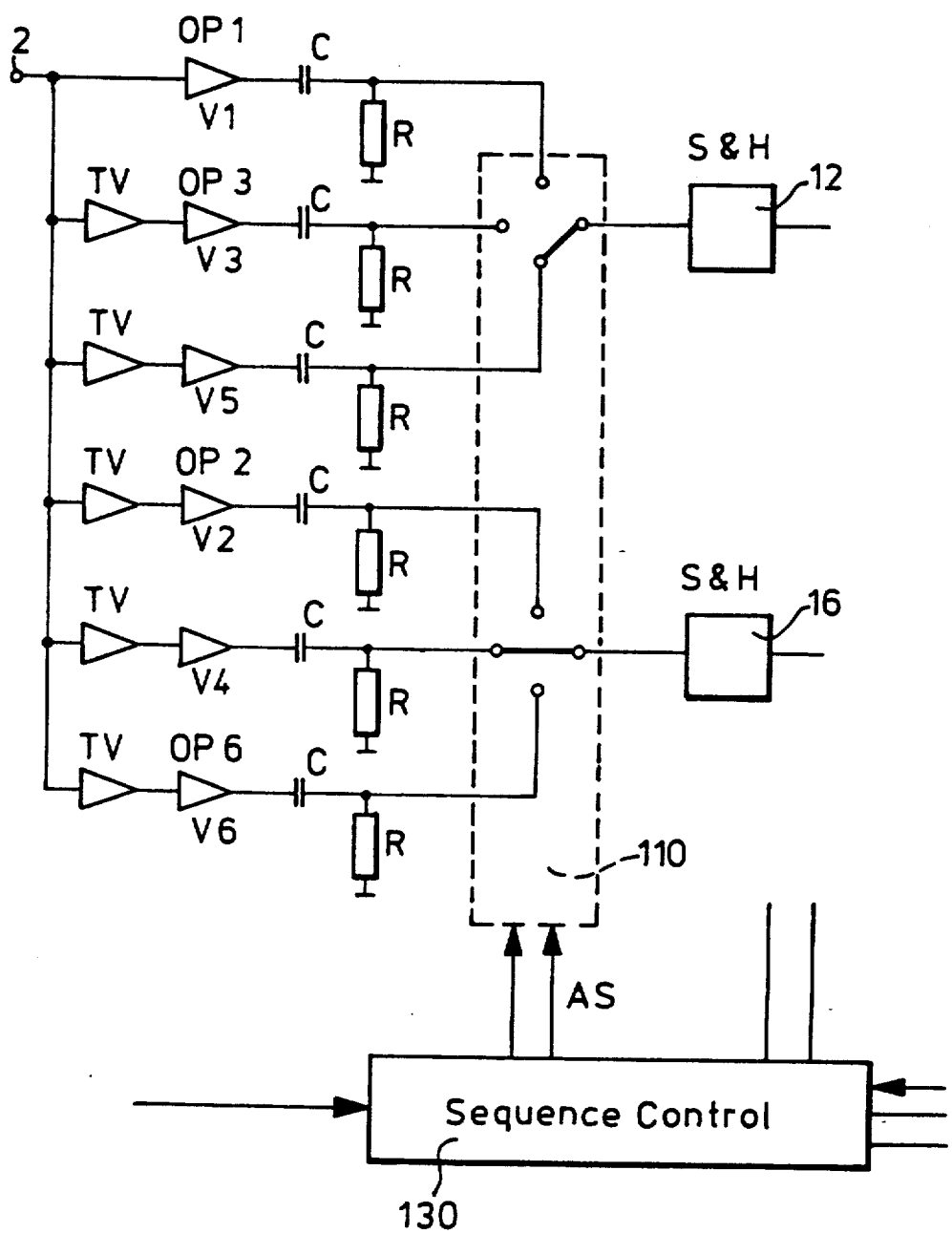
FIG. 3 shows a modification of the arrangement illustrated in FIG. 1.

FIG. 3 shows a modification of the circuit illustrated in FIG. 1, the modification differing from the arrangement of FIG. 1 only as regards the area between the input terminal 2 and the sample and hold circuits (S and H) 12 and 16, and the sequence control. Consequently, FIG. 3 shows substantially only those circuit components which differ from those of FIG. 1.

The arrangement illustrated in FIG. 3 uses a total of six operational amplifiers OP1 to OP6, the operational amplifier OP1 having the smallest amplification factor V1. The operational amplifier OP6 has the greatest amplification factor V6, the amplification factors V2 to V5 of the remaining operational amplifiers OP2 to OP5 being in between, in the order of their identification numbers. The operational amplifiers OP1, OP3 and OP5 are arranged in a group, and their output signals, which are passed through a low-pass filter 5 and an RC element each, as viewed in FIG. 1, can be selected individually for transmission to the sample and hold circuit 12 by the upper part (as viewed in FIG. 3) of a controllable change-over switch 110. Similarly, the operational amplifiers OP2, OP4 and OP6 are arranged in a group the output signals of which can be similarly selected, by the lower part of the switching-over device 110, for transmission to the scanning and holding circuit 16 known from FIG. 1. The selection is controlled by the sequence control 130. As, contrary to FIG. 1, the sequence control 130 actuates two individual switches in the controllable switching-over device 110, the sequence control is indicated by a reference numeral different from that of the sequence control 30 in FIG. 1. For the rest, the operation of the sequence control is identical to that of FIG. 1. If the input terminal 2 is supplied with an input signal which rises from a lower to a higher value, then the sequence control 130 will initially connect to the sample and hold circuit 12 the operational amplifier OP1 having the lowest amplification factor. The latter's signal, after conversion by the respective analog-to-digital converter 14 (FIG. 1), is then selected by the first controllable switching device 20 (FIG. 1) for further processing. As the input signal rises, the output signal of the operational amplifier OP2 is selected next for further processing; to this end, the switch illustrated in the lower part of the switching-over device 110 has been coupled to the output signal of the operational amplifier 2 already before the output signal of the respective analog-to-digital converter 18 (FIG. 1) is selected for further processing. If the signal continues to rise further, the upper switch of the switching-over device 110 is connected to the operational amplifier OP3 and then, i.e. when any transient conditions have steadied down, the output signal of the analog-to-digital converter 14 can be selected for further processing. As to the selection of the input signals of the remaining operational amplifiers, this is effected in line with the preceding description. It is understood that regarding the second group of operational amplifiers it would well be possible to do for example without the operational amplifier OP6 having the greatest amplification factor V6, without any material changes to the general principle. But it seems important that the amplification factor V2 be between V1 and V3, the amplification factor V4 between V3 and V5, the amplification factor V3 between V2 and V4, and the amplification factor V5 between V4 and V6 (if there is an OP6).

It will be readily appreciated by the man skilled in the art that the principle illustrated in FIG. 3 enables more than six output signals of operational amplifiers, or for example the output signals of only four operational amplifiers, to be processed with the aid of two analog-to-digital converters, in which case the upper and the lower parts of the switching-over device 110 may select two output signals each.

The operational amplifiers of the arrangement illustrated in FIGS. 1 and 3 are designed in such a way that the reverse feedback gain adjusted in the conventional manner is identical for all operational amplifiers OP1 to OP3 or OP1 to OP6, while the different gain is achieved, with otherwise identical operational amplifiers, by different voltage dividers connected to their outputs, this arrangement being not shown in the drawing for the sake of simplicity.

The reference numerals used in the claims are not to be understood as limiting the invention, but are only meant to simplify the understanding thereof.

We claim:

1. Infrared Fourier transformation spectrometer comprising:
    a non-linear analog-to-digital converter device having at least two analog-to-digital converters having outputs connected to a first controllable switching means for selectively supplying output signals of one of the analog-to-digital converters to a calculating unit,
    a plurality of amplifier means of different but constant amplification factors disposed upstream of said analog-to-digital converters for amplifying input to each of the analog-to-digital converters with sequential gain factors alternating between said analog-to-digital converters, said input signals being amplified by a constant but different amplification factor;
    a second controllable switching means for selecting one of the input signals, which has been amplified by one of the plurality of amplifiers, and
    a sequence control means for switching said first controllable switching means, said first controllable switching means being switched with a certain time delay, when switching occurs, after switching of the second controllable switching means.

2. A spectrometer according to claim 1, wherein conversion ranges of two neighboring analog-to-digital converters have overlapping working ranges.

3. A spectrometer according to claim 1 wherein the sequence control means is responsive to a value of the input signal as a function of time.

4. A spectrometer according to claim 1 wherein the sequence control means controls the said first and, if necessary, also the second switching device in response to a value and a curve of the input signals.

5. A spectrometer according to claim 1 wherein the sequence control means controls the said first switching means and, if necessary, the said second switching means in such a way that at any given time the output signals of at least two neighboring analog-to-digital converters are provided—neighboring as regards the working ranges—and are available for optional selection by the first switching means.

6. A spectrometer according to claim 1, wherein the analog-to-digital converters each have a resolution of at least 20 bits.

7. A spectrometer according to claim 1 wherein conversion ranges of two neighboring analog-to-digital converters—neighboring as regards the working ranges—overlap each other, and the sequence control means controls the first and, if necessary, also the second controllable switching means in response to the value of the input signal and time, at least over part of the measurement and according to a fixed rule, and in such a way that at any given time the output signals of at least two neighboring analog-to-digital converters—neighboring as regards the working ranges—are provided and are available for optional selection by the first switching means, and that the analog-to-digital converters have a resolution of at least 20 bits.

8. Infrared Fourier transform spectrometer comprising:
- a non-linear analog-to-digital converter device having at least two analog-to-digital converters, each preceded by a sample and hold circuit, having outputs connected to a first controllable switching means for selectively supplying the output signals of one of the analog-to-digital converters to a calculating unit,
- groups of amplifiers of different but constant amplification factors disposed upstream of each of the analog-to-digital converters, and
- second controllable switching means for selecting one of the output signals of each group of amplifiers, for transmission to the analog-to-digital converters with sequential gain factors of the amplifiers alternating between the two analog-to-digital converters in the event that said second switching means switches over, the first switching means will switch over with a certain time delay, if at all.

9. Infrared Fourier transform spectrometer comprising:
- a non-linear analog-to-digital converter device having two analog-to-digital converters, each preceded by a sample and hold circuit, having outputs connected to a first controllable switching means for selectively supplying the output signals of one of the analog-to-digital converters to a calculating unit,
- groups of amplifiers of different but constant amplification factors disposed upstream of each of the analog-to-digital converters, and
- a second controllable switching means for selecting one of the output signals of each group of amplifiers, for transmission to the analog-to-digital converters with sequential gain factors of the amplifiers alternating between the two analog-to-digital converters.

* * * * *